United States Patent [19]

Ha

[11] Patent Number: 5,784,317

[45] Date of Patent: Jul. 21, 1998

[54] FLASH MEMORY DEVICE USING AN OPERATIONAL CIRCUIT FOR BIT-BY-BIT VERIFYING OF PROGRAMMED DATA IN MEMORY CELLS AND METHOD OF PROGRAMMING THE SAME

[75] Inventor: Chang Wan Ha, Kyungki-Do, Rep. of Korea

[73] Assignee: Hyundai Electronics Industries Co., Ltd., Kyungki-Do, Rep. of Korea

[21] Appl. No.: 773,604

[22] Filed: Dec. 27, 1996

[30] Foreign Application Priority Data

Dec. 27, 1995 [KR] Rep. of Korea .................... 95-58452

[51] Int. Cl.⁶ .................................................. G11C 16/06
[52] U.S. Cl. ............................. 365/185.22; 365/185.33; 365/189.05; 365/190; 365/189.07
[58] Field of Search ...................... 365/185.22, 185.33, 365/189.05, 190, 189.07

[56] References Cited

U.S. PATENT DOCUMENTS

| | | | |
|---|---|---|---|
| 4,811,294 | 3/1989 | Kobayashi et al. | 365/185.22 |
| 5,299,162 | 3/1994 | Kim et al. | 365/185.17 |
| 5,323,351 | 6/1994 | Challa | 365/218 |
| 5,357,463 | 10/1994 | Kinney | 365/185.22 |

*Primary Examiner*—David C. Nelms
*Assistant Examiner*—Andrew Q. Tran
*Attorney, Agent, or Firm*—Fish & Richardson P.C.

[57] ABSTRACT

A flash memory cell and technique which preserves reliability but does not decrease the speed of the program operation. The system prevents degradation of reliability of the device due to stress from unnecessary over-writes. An operational circuit controls data on a bit unit preventing unnecessary over-writes generated during verification of the programmed data.

6 Claims, 5 Drawing Sheets

5,784,317

FLASH MEMORY DEVICE USING AN OPERATIONAL CIRCUIT FOR BIT-BY-BIT VERIFYING OF PROGRAMMED DATA IN MEMORY CELLS AND METHOD OF PROGRAMMING THE SAME

TECHNICAL FIELD

The present invention relates to a flash memory device using an operational circuit for bit-by-bit verification of programmed data in memory cells and a method of programming the same that can prevent unnecessary over-writes during the verification.

BACKGROUND INFORMATION

In general, a memory cell of a flash memory device having both functions of electrical programming and erasure has a structure including a tunneling oxide film 64, a floating gate 65, a dielectric film 66 and a control gate 67 as shown in FIG. 1. These elements are stacked on a silicon substrate 61. A source 62 and a drain 63 are formed in the silicon substrate 61 on opposite sides of the stacked elements. Program, erasure and read operations of this memory cell are performed by applying different sets of voltages to the gates of the memory cell.

To program data into the memory cell an electrical charge is placed on the floating gate 65. A voltage of 12 V to 13 V is applied to the control gate 67, 5 V to 7 V is applied to the drain 63, and ground voltage is applied to the source 62. The high voltage applied to the control gate 67 forms a channel in the silicon substrate 61 under the floating gate 65. The voltage applied to the drain 63 forms a high electrical field region on a portion of the silicon substrate 61 adjacent to the drain 63. When a current passes through the high electrical field region, hot electrons are produced. Some of the hot electrons are injected into the floating gate 65 by a vertical electrical field generated by the high voltage applied to the control gate 67. The injection of these hot electrons increases a threshold voltage $V_T$ of the memory cell.

In order to erase data programmed in the memory cell a charge stored in the floating gate 65 is discharged. Voltage between −10 V and 11 V is applied to the control gate 67, and voltage of 5 V is applied to the source 62. The drain 63 is kept in a floating state. Due to tunneling effects, the electrons previously injected into the floating gate 65 move toward the source 62. As a result, the threshold voltage $V_T$ of the memory cell drops.

In order to read data programmed into the memory cell, a word line selective bias voltage is applied to the control gate 67. Voltage of 1 V to 2 V is applied to the drain 63, and ground voltage is applied to the source 62. The data programmed into the cell is determined by the threshold voltage of the memory cell.

FIG. 2 is a block diagram of a conventional flash memory device. A memory device 1 includes a plurality of memory cells which are arranged in a matrix. The memory cells are laid out between word lines (dividing the memory cells into words) and bit lines (dividing the words into bits). To program data into the memory device, data DQ0 through DQN and addresses A0 through AM are input to a command register 10. In response to a write enable signal $\overline{WE}$, the command register 10 sends a signal to a state and looping control circuit 30. At the same time, the data DQ0 through DQN are latched to a latch circuit 6 via an input/output (I/O) buffer 8 by the write enable signal $\overline{WE}$. The state and looping control circuit 30 sends a signal to a mode control circuit 9. The mode control circuit 9 controls program, erasure, read-out and verification operations. The mode control circuit 9 sends signals to a X-decoder 2, a Y-decoder 4 and a Y-gating 3 to select the memory cells corresponding to the addresses A0 to AM. The Y-gating 3 is also connected to a latch circuit 6 to receive data to be written into memory cells. Thus as memory cells are selected in response to signals from the mode control circuit 9, the data DQ0 to DQN are programmed into those memory cells.

After the programming operation, a verification operation is required to determine whether the programming has been successfully completed. The state and looping control circuit 30 sends a signal indicating verification mode to the mode control circuit 9, which in turn sends signals to the X-decoder 2, the Y-gating 3 and a comparator 7. Thereafter, the data programmed into the memory device 1 is input to the Y-gating 3. From the Y-gating 3 the data is sent to a sense amplifier 5 and then the comparator 7. The original data DQ0 to DQN is still latched at the latch circuit 6 and is input to the comparator 7 as well. Then the programmed data from the memory device 1 is compared with the original data DQ0 through DQN. If the data latched at the latch circuit 6 and the programmed data are identical, the program operation is finished. If the memory device were in read-out mode, the data would then be output through the I/O buffer 8 in response to an output enable signal $\overline{OE}$. However, if the data DQ0 through DQN latched at the latch circuit 6 and the programmed data are different from each other, the comparator 7 sends a signal indicating failure to the state and looping control circuit 30 and the mode control circuit 9. These program and verification operations are then repeated until verification is successful (the programmed data is the same as the latched data)or are terminated when the number of repetitions reaches a predetermined number stored within the state and looping control circuit 30.

FIG. 3 is a flowchart illustrating a method of programming a conventional flash memory device such as the one described above. Addresses A0 through AM and data DQ0 through DQN are loaded (step 101). Looping number N is set (step 103) to "1." The loaded data DQ0 through DQN is then programmed into the memory device (step 104). The programmed data is verified (step 105), and the verified data is compared with the loaded data (step 106). If the loaded data is identical to the verified data, the programming operation is finished. If the loaded data is not identical to the verified data, the looping number N is compared with a predetermined looping number M (step 108). If the looping number N is not equal to the predetermined looping number M, the looping number N is incremented by one (set to N+1; step 110), and then the process returns to step 104.

If, after repeating the programming and verification operations as described above a number of times equal to the predetermined looping number M (such that the looping number N is then equal to M), the loaded data is still not identical to the verified data, failure of the programming operation is reported (step 109).

In such a conventional flash memory device, if the programming operation is not finished successfully in one pass, the memory cells programmed at previous steps will be programmed again and again so long as the verified data does not equal the loaded data. Repeatedly programming the same memory cells stresses those memory cells leading to reduction of the reliability of the flash memory device. Therefore, the reliability of the device is degraded by stress from unnecessary over-writes.

SUMMARY OF THE INVENTION

It is an object of the present invention to provide a flash memory device and a method of programming the same which can prevent unnecessary over-writes generated during verification of the programmed data.

To achieve this object, a flash memory device according to the present invention comprises an operational circuit. The operational circuit generates a reciprocal of data which has been programmed into the memory device. If verification of the programmed data fails (that is, the programmed data is not equal to the data to be programmed), the operational circuit generates a reciprocal of the programmed data and adds that reciprocal to the original data. This sum is then programmed into the memory device, where in a conventional flash memory device the original data would be programmed again. Thus rather than programming the same data repeatedly into the memory device, the sum of the programmed data and its reciprocal is programmed upon verification failure. This reduces the stress on memory cells from excessive and unnecessary over-writing.

BRIEF DESCRIPTION OF THE DRAWINGS

Other aspects and advantages of the present invention will be understood by reading the detailed explanation of the embodiment with reference to the accompanying drawings in which.

DETAILED DESCRIPTION OF THE INVENTION

Figure 1:
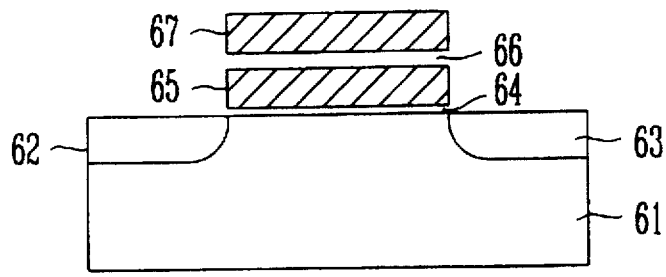
FIG. 1 is a view illustrating the structure of a memory cell of a conventional flash memory device.
Figure 3:
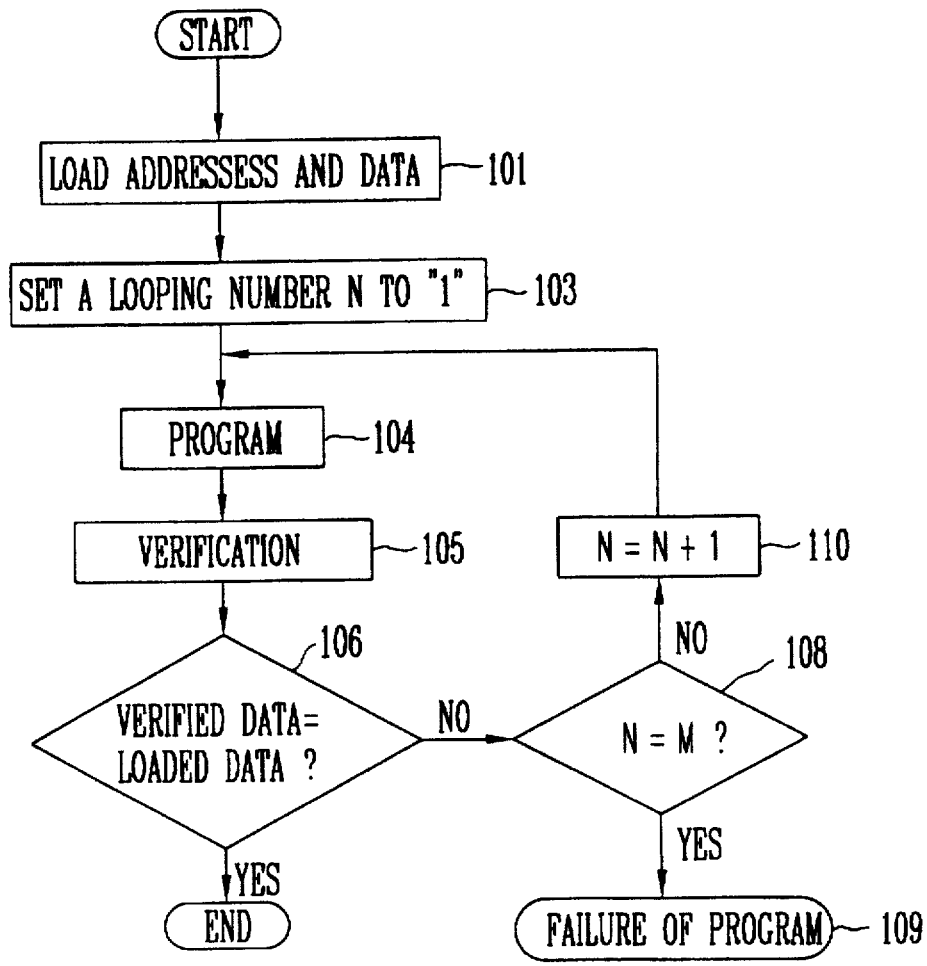
FIG. 3 is a flow chart illustrating a method of programming a conventional flash memory device.
Figure 2:
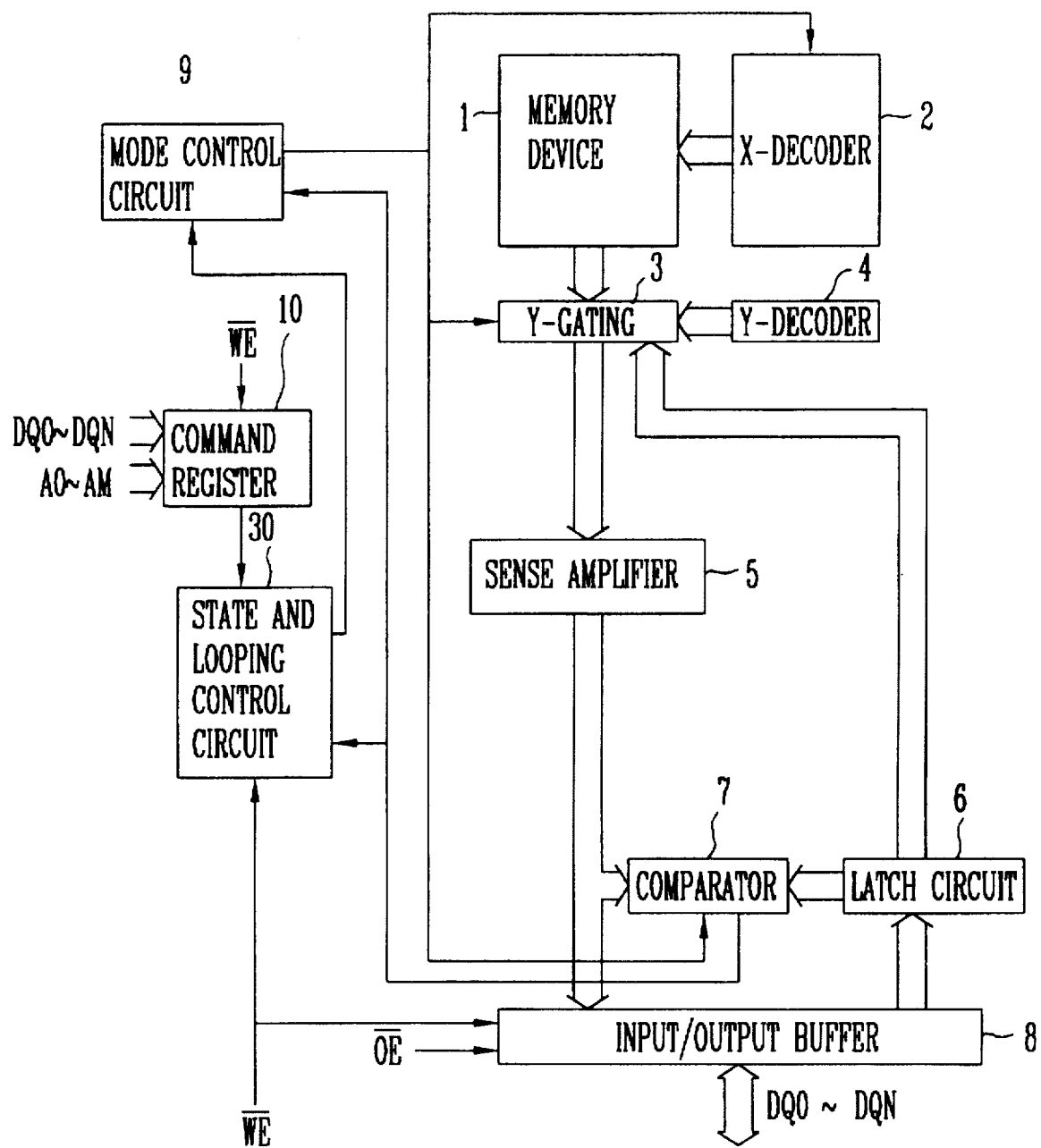
FIG. 2 is a block diagram illustrating a conventional flash memory device.
Figure 4:
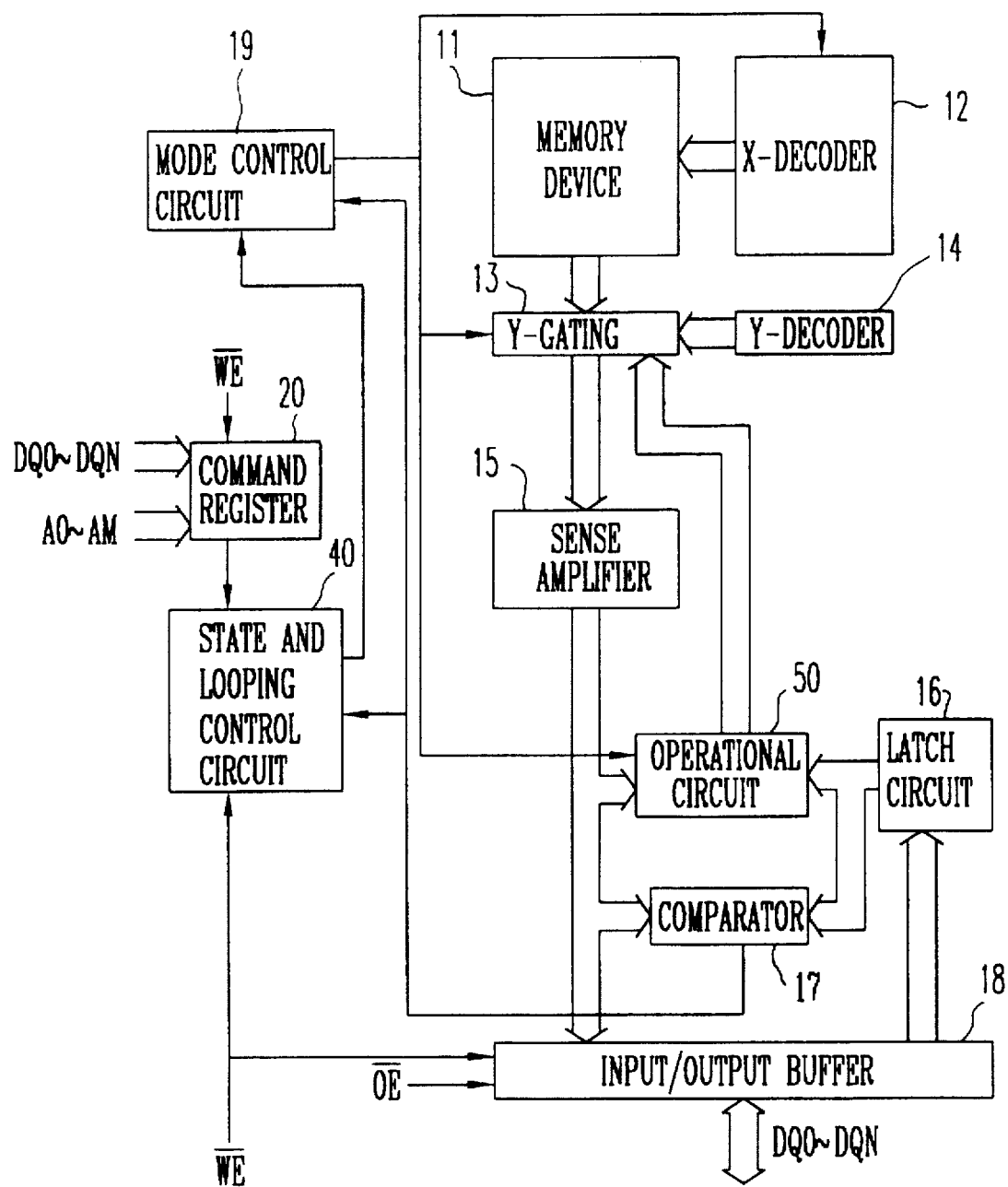
FIG. 4 is a block diagram illustrating a flash memory device according to one embodiment of the present invention.

FIG. 4 is a block diagram illustrating a flash memory device according to one embodiment of the present invention. A memory device 11 includes a plurality of memory cells which are arranged in a matrix. The memory cells are laid out between word lines (dividing the memory cells into words) and bit lines (dividing the words into bits). To program data into the memory device 11, data DQ0 through DQN and addresses A0 through AM are input to a command register 20. In response to a write enable signal $\overline{WE}$, the command register 20 sends a signal to a state and looping control circuit 40. At the same time, the data DQ0 through DQN are latched to a latch circuit 16 via an input/output (I/O) buffer 18 by the write enable signal $\overline{WE}$. The state and looping control circuit 40 sends a signal to a mode control circuit 19. The mode control circuit 19 controls program, erasure, read-out and verification operations. The mode control circuit 19 sends signals to a X-decoder 12, a Y-decoder 14 and a Y-gating 13 to select the memory cells corresponding to the addresses A0 to AM. The Y-gating 13 is also connected to the latch circuit 16 to receive data to be written into memory cells. Thus as memory cells are selected in response to signals from the mode control circuit 19, the data DQ0 to DQN are programmed into those memory cells.

After this programming operation, a verification operation is required to determine whether the programming has been successfully completed. The state and looping control circuit 40 sends a verification mode signal to the mode control circuit 19. The mode control circuit 19 then sends signals to the X-decoder 12, the Y-gating 13 and an operational circuit 50. The data programmed into the memory device 11 is input to the Y-gating 13. From the Y-gating 13 the programmed data is sent to a sense amplifier 15 and then to a comparator 17 and the operational circuit 50. The latch circuit 16 is also connected to the comparator 17 and the operational circuit 50. The original data DQ0 through DQN latched at the latch circuit 16 is sent to the comparator 17. If the latched data is identical with the programmed data, the program operation is finished. However, if the latched data is not identical with the programmed data, the comparator 17 sends a signal indicating the failure to the state and looping control circuit 40 and the mode control circuit 19. Then, the mode control circuit sends a signal to the operational circuit 50 so that the operational circuit 50 generates a reciprocal of the programmed data. The generated reciprocal data and the latched data are added on a bit adding unit in the operational circuit 50, generating added data. Any carries occurring from the adding operation are disregarded. Thereafter, the added data is programmed again into the memory device 11.

An example using data of 4 bits will be explained below. Let the data DQ0 through DQN latched at the latch circuit 16 be 0110, and the programmed data output from the memory device 11 through the sense amplifier 15 be 1110. The operational circuit 50 generates a reciprocal data 0001 of the programmed data 1110. The generated reciprocal data 0001 and the data 0110 latched at the latch circuit 16 on a bit unit. Then the new added data 0111 is programmed into the memory device 11. These program and verification operations are repeated until the programming is finished successfully (that is, the programmed data equals the latched data) or as many times as the predetermined looping number set in the state and looping control circuit 40.

A method of programming a flash memory device according to the one embodiment of the present invention will be explained by reference to FIG. 5A and FIG. 5B.

Figure 5A:
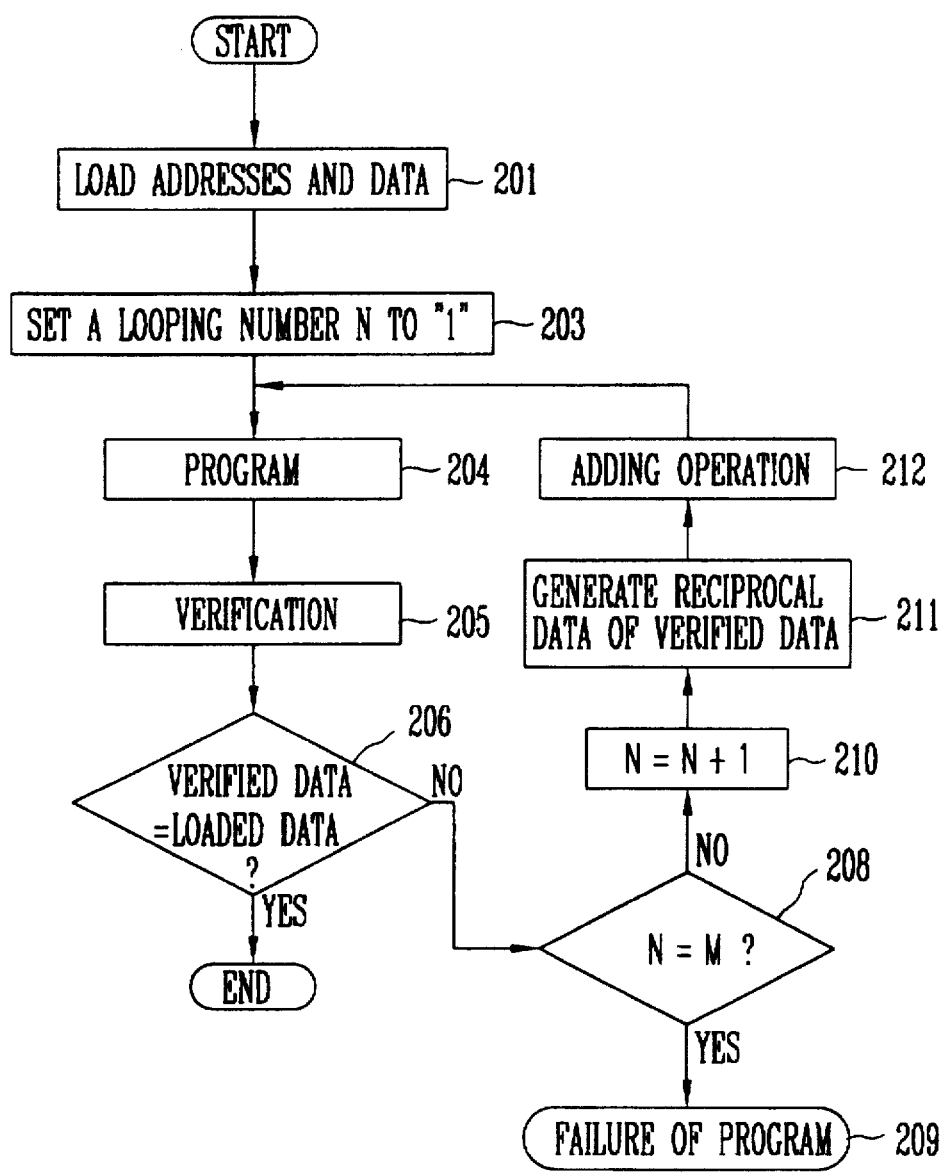
FIG. 5A and FIG. 5B are flow charts illustrating a method of programming a flash memory device according to one embodiment of the present invention.

FIG. 5A shows steps of a programming operation after all the memory cells of the memory device 11 have been erased. Addresses A0 through AM and data DQ0 through DQN are loaded (step 201). A looping number N is set to "1" (step 203). The loaded data DQ0 through DQN are then programmed into the memory cell array (step 204). Thereafter, the programmed data is verified (step 205), and the verified data is compared with the loaded data (step 206). At this time, if the loaded data is identical to the verified data, the programming operation is finished. However, if the loaded data is not identical to the verified data, the looping number N and the predetermined looping number M are compared (step 208). If the looping number N is not equal to the predetermined looping number M, the looping number N is incremented (set to N+1; step 210). A reciprocal of the verified data is generated (step 211). The reciprocal data and the loaded data are then added on a bit unit (step 212), generating an added data. Any carries occurring from the operation are disregarded. Thereafter, the added data is programmed again into the memory device (step 204).

If, after repeating the programming and verification operations as described above a number of times equal to the predetermined looping number M (such that the looping number N is then equal to M), the loaded data is still not identical to the verified data, failure of the programming operation is reported (step 109).

Figure 5B:
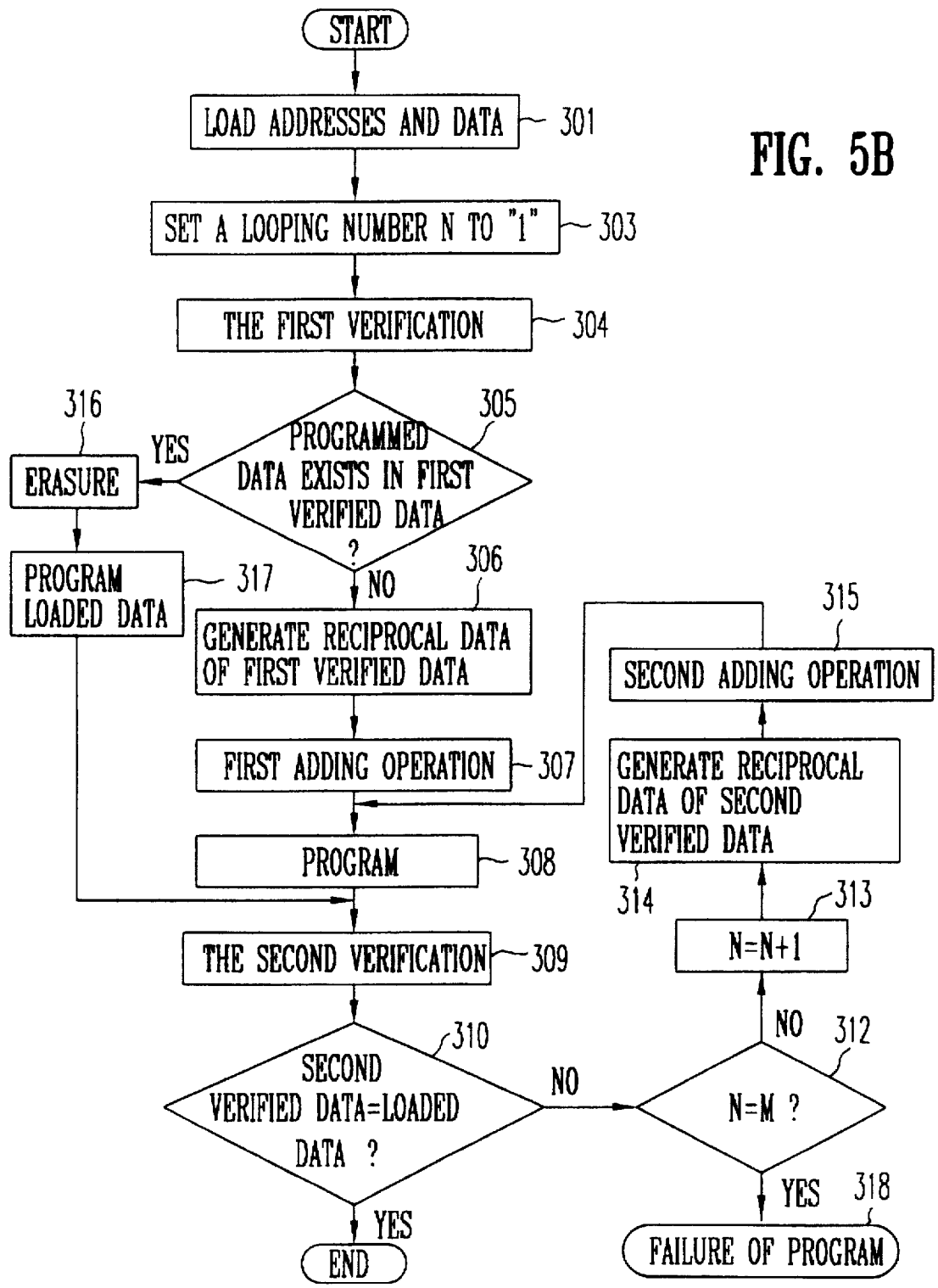

FIG. 5B shows steps of a programming operation when new data is programmed in a memory device 11 in which old data has already been programmed. Addresses A0 to AM and data DQ0 to DQN are loaded (step 301). A looping number N is set to "1" (step 303). The data which is already programmed in the memory cell array is verified (step 304). The first verified data is checked to determine whether a programmed bit exists (step 305). If the programmed bit exists in the first verified data, the data which is programmed in the memory device 11 is erased (step 316) and the loaded data DQ0 to DQN are programmed (step 317).

If, however, the programmed bit does not exist, a reciprocal of the first verified data is generated (step 306). A first adding operation is performed, by which the reciprocal data and the loaded data are added to each other on a bit unit (step 307), generating added data. Any carries occurring from the adding operation are disregarded. The added data is programmed on the memory device 11 (step 308).

The programmed data is then verified in a second verification step (step 309). The second verified data is compared to the loaded data (loaded in step 301). If the second verified data is equal to the loaded data DQ0 to DQN, the program operation ends (step 310).

However, if the second verified data is not equal to the loaded data, the looping number N is compared to the predetermined looping number M (step 312). If the looping number N is equal to the predetermined looping number M, the program operation has failed. If the looping number N is not equal to the predetermined looping number M, the looping number N is incremented (set to N+1; step 313) and a reciprocal of the second verified data is then generated (step 314). A second adding operation is performed, by which the reciprocal data (of the second verified data) and the loaded data are added on a bit unit (step 315), generating added data. Any carries occurring from the adding operation are disregarded. Added data (from the second adding operation) is programmed into the memory device 11 again (step 308). Thereafter, the process repeats until the verified data is equal to the loaded data and the process ends, or the looping number N is equal to the predetermined looping number M, at which point failure of the programming operation is reported (step 318).

As described above, when verification fails, new data is generated by an operational circuit (the sum of the original data and the reciprocal of the data programmed into the memory device) and programmed into the memory device. Accordingly, a memory cell which has already been programmed is not programmed again with the same data, but rather the new data is programmed. Accordingly, stress due to unnecessary over-writes which may occur in the verification process are prevented. Using the operational circuit described above, degradation of reliability in a semiconductor device due to stress from excessive and unnecessary over-writes can be prevented without programming speed reduction.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

I claim:

1. A flash memory device comprising:

a command register to which data and addresses are input, said command register being operated in response to a write enable signal;

a state and looping control circuit coupled to said command resister to which an output signal of said command register and said write enable signal are input;

a mode control circuit coupled to said state and looping control circuit for controlling programming, erasure, read-out and verification operations in response to an output signal of said state and looping control circuit;

an input and output buffer to input data from outside or output data to outside in response to said write enable signal and an output enable signal;

a latch circuit coupled to said input and output buffer for latching data which are input from said input and output buffer;

a memory device having a plurality of memory cells which are connected between word lines and bit lines in a matrix;

a X-decoder coupled to said memory device, where said X-decoder selectively outputs signals to said word lines of said memory device in response to an output signal of said mode control circuit;

a Y-decoder to selectively output signals to said bit lines of said memory device;

a sense amplifier;

a Y-gating connected between said Y-decoder and said memory device, said Y-gating for outputting data programmed into said memory device to said input and output buffer through said sense amplifier in response to said output signal of said mode control circuit;

an operational circuit coupled to said mode control circuit, said input and output buffer, said sense amplifier and said latch circuit, where said operational circuit is for generating a reciprocal data of data output through said sense amplifier in response to said output signal of said mode control circuit, for adding said reciprocal data and data latched at said latch circuit on a bit unit to generate added data, and for programming said added data into said memory device through said Y-gating; and a comparator coupled between said sense amplifier and said latch circuit for comparing data output through said sense amplifier with data latched at said latch circuit according to the output signal of said mode control circuit, said comparator for outputting an output signal to said state and looping control circuit and said mode control circuit.

2. The flash memory device in claim 1, wherein said operational circuit disregards carries occurring from the adding process in which the generated reciprocal data and the data latched at the latch circuit are added on a bit unit.

3. A method of programming a flash memory device, comprising the steps of:

loading addresses and data;

setting a looping number to an initial number;

programming the loaded data into the memory device;

verifying the programmed data, generating verified data;

comparing the loaded data with the verified data;

finishing the programming method, if the loaded data and the verified data are identical to each other;

comparing the looping number and a predetermined looping number, if the loaded data and the verified data are not identical to each other;

incrementing the looping number, if the looping number is not equal to the predetermined looping number;

generating a reciprocal data of the verified data;

adding the reciprocal data of the verified data and the loaded data by bit unit, and programming new data generated as a result of the adding step into the memory device; and notifying failure of the programming method if the looping number is equal to the predetermined looping number.

4. The method of programming a flash memory device of claim 3, wherein carries occurring in the adding step in which the reciprocal data of the verified data and the loaded data are added bit by bit are disregarded.

5. A method of programming a flash memory device, comprising the steps of:

loading addresses and data;

setting a looping number to an initial number;

first verifying data currently programmed into the memory device, generating first verified data;

determining whether any programmed data exists in the first verified data;

generating reciprocal data of the first verified data, if there does not exist any programmed data in the first verified data;

performing a first operation of adding the reciprocal data of the first verified data and the loaded data bit by bit;

programming the data generated as a result of the first operation into the memory device;

second verifying the data programmed into the memory device;

comparing the second verified data with the loaded data;

finishing the programming method, if the second verified data and the loaded data are identical to each other;

comparing the looping number and a predetermined looping number, if the second verified data and the loaded data are not identical;

incrementing the looping number, if the looping number is not equal to the predetermined looping number;

generating reciprocal data of the second verified data;

performing a second operation of adding the reciprocal data of the second verified data and the loaded data, and programming new data generated as a result of the second operation into the memory device;

erasing the data programmed into the memory device, if there exists any programmed data in the first verified data;

programming the loaded data into the memory device, and returning to the second verification step; and notifying failure of the programming method, if the looping number is equal to the predetermined looping number.

6. The method of programming a flash memory device in claim 5, wherein carries occurring from the first and second operations are disregarded.

* * * * *